United States Patent

Zejda

Patent Number: 5,439,522
Date of Patent: Aug. 8, 1995

[54] DEVICE FOR LOCKING A FLAT, PREFERABLY DISCOID SUBSTRATE ONTO THE SUBSTRATE PLATE OF A VACUUM COATING APPARATUS

[75] Inventor: Jaroslav Zejda, Rodenbach, Germany

[73] Assignee: Leybold Aktiengesellschaft, Hanau am Main, Germany

[21] Appl. No.: 262,962

[22] Filed: Jun. 21, 1994

[30] Foreign Application Priority Data

Sep. 25, 1993 [DE] Germany ............... 43 32 674.9

[51] Int. Cl.[6] .............................................. B05C 13/00
[52] U.S. Cl. .................................... 118/500; 118/719; 118/730; 118/503; 414/217; 414/223; 414/225
[58] Field of Search ............. 118/500, 719, 730, 503; 267/47, 57; 414/217, 222, 223, 225

[56] References Cited

U.S. PATENT DOCUMENTS

| | | |
|---|---|---|
| 4,820,106 | 4/1989 | Walde ........................... 414/217 |
| 5,062,384 | 11/1991 | Foley et al. .................. 118/500 |
| 5,374,315 | 12/1994 | de Boer et al. ............... 118/500 |

FOREIGN PATENT DOCUMENTS 3716498  5/1987  Germany .

Primary Examiner—Timothy M. McMahon
Attorney, Agent, or Firm—Felfe & Lynch

[57] ABSTRACT

In a device for locking a flat, discoid substrate 9 provided with a central opening 38 onto a substrate plate 22 provided with a centering post 35 projecting above the substrate bearing surface 42 of a vacuum coating apparatus for transporting the substrate from one to the other treatment station and/or for putting the substrate into or taking it out of the treatment chamber or transport chamber 13, 14 through an airlock, the centering post 35 has a cross-sectional area enabling the centering post 35 to pass through the central opening 38 and it is provided with an annular groove which runs approximately at the level of the upper surface of the substrate remote from the plane of the substrate bearing surface 42, while an endless slantingly wound coil spring 37 is placed into the annular groove 40, and upon the action of a force (P) directed radially toward the spring flattens the outer torus surface enveloping the spring 39, and thus locks the substrate pushed over the spring 37 at the upper edge of the opening 38 in the manner of a snap fastener.

3 Claims, 2 Drawing Sheets

DEVICE FOR LOCKING A FLAT, PREFERABLY DISCOID SUBSTRATE ONTO THE SUBSTRATE PLATE OF A VACUUM COATING APPARATUS

The invention relates to a device for locking a flat, preferably discoid substrate provided with a central opening, onto the substrate plate provided with a centering post projecting above the substrate bearing surface in a vacuum coating apparatus, especially for carrying the substrate from one to the other treatment station, and into or out of the transport or treatment chamber, respectively.

In vacuum process technology, especially in thin coating technology, the coating of substrates, such as Compact Disks (CD's), is known. The Compact Disk is a modern storage medium for digital data. In a sputtering process the pressed plastic disks are coated with, for example, an aluminum layer of less than one ten-thousandth of a millimeter. The coating apparatus used for this purpose have, in many cases, a turntable for handling the substrates.

A robot loads and unloads the apparatus through an airlock in a clean room. From the airlock the turntable transports the substrate holder with the substrate through the vacuum chamber. The sputtering is performed by a high-power sputtering cathode which is made in the form of a magnetron.

German Offenlegungsschrift 37 16 498 has already disclosed an apparatus for passing a substantially flat workpiece through an airlock into and out of an evacuated coating chamber and for feeding and returning the workpiece into and out of the range of a coating source for the purpose of treating the workpiece surface.

The apparatus according to this disclosure is characterized by a coating apparatus disposed in the area of the coating chamber and having one or more cover-like workpiece holders by means of which the workpieces can be brought into a position adjacent to an opening in the coating chamber, from which position the opening can be closed on the one hand by the workpiece holder and on the other by a lift plate which is held and carried on a turntable journaled inside of the coating chamber, while the workpiece holder can be pressed by a jack supported on the coating apparatus, and the lift plate by a lifting means fastened to the bottom plate, against the opening in the cover of the coating chamber.

The substrate, provided with a central opening, in this apparatus according to DE 37 16 498 A1, lies on the lift plate during the coating process, and is secured by means of a post that is part of the lift plate against lateral displacement or against displacement in the plane of the lift plate. In addition, the disk-bearing surface is set slightly below the top surface of the lift plate, so that the discoid substrate is in contact at its circumferential outer edge with the raised margin of the lift plate.

Now, in practice it has been found that neither the post alone nor the combination of raised margin and post offers sufficient security against displacement of the substrate, so that mechanical trouble cannot be ruled out in practice. Such trouble brings the result that the apparatus has to be vented and then partially disassembled in order to remove the jammed substrate from the process chamber. Since the substrates are extraordinarily fragile they are also destroyed in the case of mechanical difficulties, so that the fragments of the substrate can somehow find their way into the sensitive areas of the apparatus. Now, in order additionally to lock or hold the substrates fixed in place on the substrate plates, it has already been proposed to provide the posts with resilient buttons or lugs which stand out radially but can move radially inward toward the axis of rotation of the post. Such spring catches, however, have the disadvantage that they damage the central opening in the substrate when the substrate is pushed onto the post or pulled off from it. Since the lugs or buttons snap over the wear-sensitive edge of the central opening only at three or four points, they apply a relatively great point pressure, so that the edge of the opening is easily damaged, usually fractured, so that tiny particles can get into the process chamber to greatly interfere with the coating process.

It is therefore the purpose of the present invention to create a device of the kind in question which on the one hand will assure a secure holding of the substrates on the substrate plate, and on the other hand will act as gently as possible on the edges of the central opening. Furthermore, the device is to be especially simple in construction so as to permit high reliability in operation, and lastly any slight differences in the thickness of the discoid substrate is to have no effect on the firm seating of the substrate, nor on the setting and releasing forces.

This purpose is accomplished in accordance with the invention in that the centering post has a cross-sectional area enabling the centering post to pass through the central opening, and is provided with an annular groove running approximately in the plane of the substrate surface facing away from the substrate bearing surface, while an endless slant-wound coil spring shaped in a toroidal configuration is placed in the annular groove, and the coil surface determined by each loop includes with the plane determined by the axis of rotation and the place where this loop makes contact with the inside wall of the groove on the centering post an angle that is greater than 45 degrees, preferably 50 to 60 degrees, so that when a force acts on the spring radially toward the axis of rotation this angle increases, while the torus surface enveloping the spring flattens and thus locks the substrate pushed over the spring at the upper edge of the opening in the manner of a snap fastening.

In accordance with the invention, a device for locking a flat substrate provided with a central opening, onto a substrate plate provided with a centering post projecting above a substrate bearing surface of a vacuum coating apparatus comprises: a centering post having a cross-sectional area which enables the centering post to pass through a central opening of a flat substrate and having an annular groove which runs approximately at a level of an upper surface of the substrate remote from a plane of a substrate bearing surface, an endless coil spring shaped into a toroid structure being disposed in the annular groove, a spiral area (W) determined by a coil forming an angle ($\alpha$) that is greater than 45 degrees with a plane (E) determined by a rotation axis (R) and a place where the coil contacts an inner wall of the groove in the centering post, so that upon the application to the spring of a force acting radially on an axis of rotation, the angle ($\alpha$) is augmented, and then a toroid surface enveloping the spring flattens and thus locks the substrate pushed over the spring in the area of the upper edge of the opening, in the manner of a snap fastening.

For a better understanding of the invention, together with other and further objects thereof, reference is made to the following description, taken in connection with the accompanying drawings, and its scope will be pointed out in the appended claims.

Referring now to the drawings.

Figure 1:
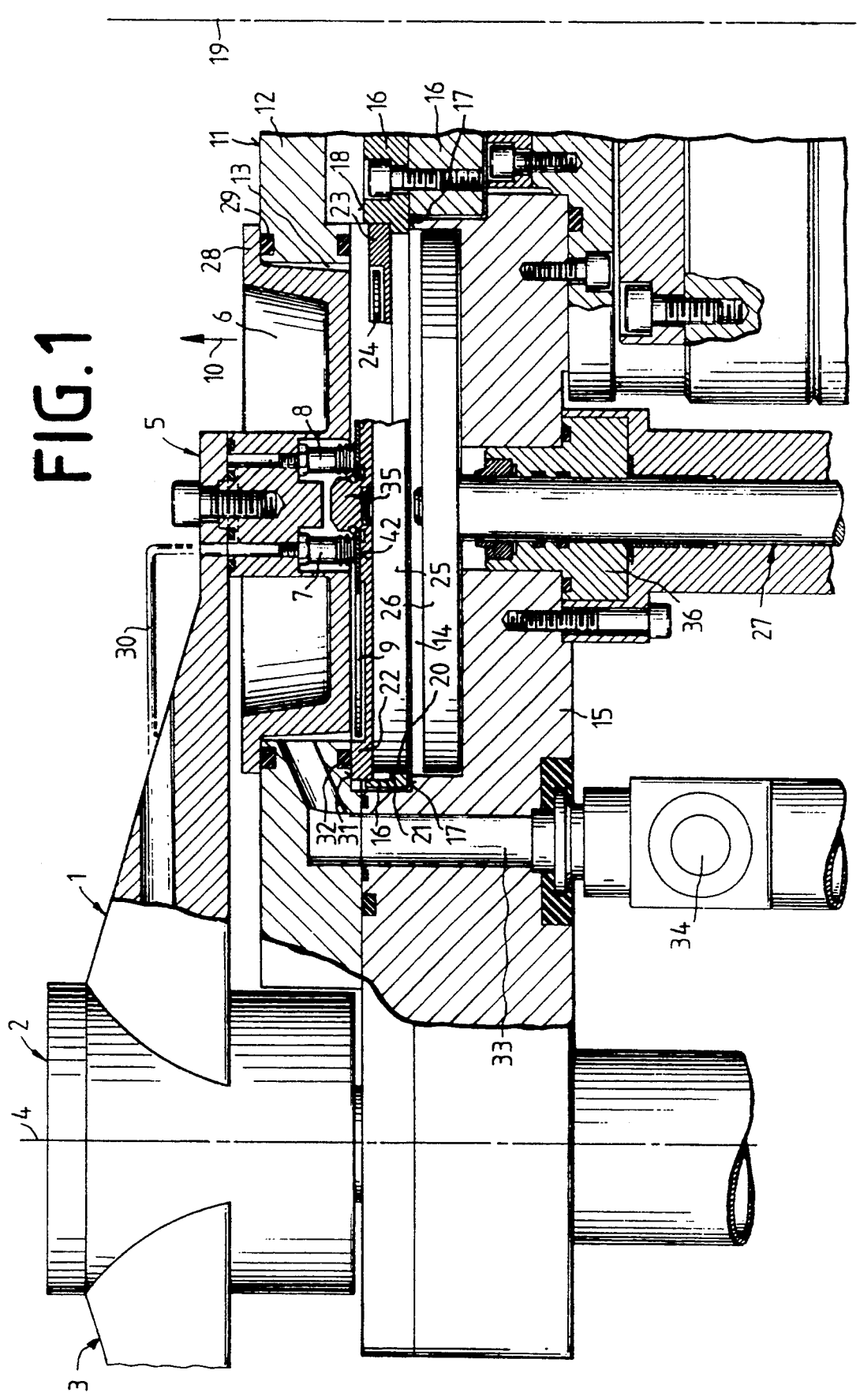
FIG. 1 is a partial cross-sectional view of a device for putting a disk into and removing it from a vacuum chamber of a coating apparatus which is equipped with a cathode station not represented.

The number 1 identifies a beam which can be raised and lowered and swiveled by the unit 2. The beam is part of a transporting system which is equipped with a double swiveling arm. The first arm, beam 1 in the present case, is represented in the figure. The second beam which is disposed opposite the first beam is shown only in part. It bears the reference number 3.

The double arm is rotatable, swinging about the axis 4. Rotation brings the first beam into the position of the second beam, while the second beam arrives at the position of the first beam.

At the right end 5 of the beam is a cover 6. In the cover three suction devices, of which two suction devices 7 and 8 are represented in the figure, which serve to push down, i.e., hold a substrate. In the present case the substrate consists of a disk 9 of which only the left portion is represented in the figure. When the beam is raised by the unit, it lifts the cover 6 in the direction of the arrow 10. After the cover is above the top edge 11 of the vacuum chamber cover 12 the beam can be rotated 180 degrees, see above.

The airlock 13, which is small in comparison to the vacuum chamber, can be separated from the vacuum chamber 14 of the coating apparatus, as will be described in detail further on. The bottom part of the vacuum chamber bears the reference number 15.

In FIG. 1 only part of the vacuum chamber is shown, which cooperates with the entry station. The vacuum chamber in the present embodiment is of a flat configuration. In it is contained a turntable 16. The reference number 16 appears several times in the figure to clarify the configuration of the turntable. Only that part of the turntable that cooperates with the airlock station is shown in the figure.

The bottom edge of the turntable is marked 17. The reference number 17 is used twice in order to clarify the position of this bottom edge. 18 is the upper edge of the turntable. The turntable can rotate within the vacuum chamber, marked 14, about the axis 19.

The turntable can have four receiver openings, one of which is shown in the figure, where it bears reference number 20. The receiver opening consists of a cylindrical recess in the flat turntable 16.

On account of the sectional representation chosen, the receiver opening appears as a line 20. This is the border line or the cut circumferential surface of the cylindrical recess.

At the margin or circumferential surface 20 of the receiver opening in the turntable 16 there is provided a ledge 21 on which the substrate holder 22 can rest.

On the right side of the drawing a substrate holder 23 is shown, in the position in which is set down on the ledge 21. On the left side the substrate holder, see above, is identified as 22, in its raised position.

24 identifies the substrate or disk which lies in the substrate holder.

25 and 26 indicate two positions of a supporting plate, 25 indicating the supporting plate in its upper position, and 26 the supporting plate in its lower position. The supporting plate is moved axially by a raising means 27.

36 identifies a sealing and guiding means. The area 14, see above, is part of the vacuum chamber. So even during loading and unloading it is under vacuum.

The procedure for the movement of a workpiece—here a disk—in and out through an airlock will now be described.

When the beam 1 is in a position turned 180 degrees from the one shown in the figure, a disk is picked up, i.e., sucked up, by the suction device 7 and 8. The beam 1, and with it the cover 6 and disk 9, is raised and then turned 180 degrees about the axis 4. They are then in a position above the position shown in FIG. 1.

Then the beam with cover and disk is lowered and arrives at the position represented in the Figure. The margin 28 of the cover lies sealingly on the gasket 29. This is preferably an O-ring.

The suction line 30, or vacuum line for the suction devices 7 and 8, is shut off, so that the suction or holding effect stops. The disk 9 then is laid into the substrate holder or substrate plate 22, the central opening 38 of disk 9 being placed on the centering post 35 and being simultaneously pushed over the toroidal spring 39 to such an extent that the disk is beneath the radially yielding spring 39.

The supporting place has previously been raised by the lifting means 27 to position 25. The substrate holder 22 is urged by the supporting plate against the bottom wall 31 of the vacuum chamber against the gasket (O-ring) 32. The airlock 13 is now sealed off air-tight from the atmosphere and from the vacuum chamber.

The airlock is then evacuated through the line 33. The airlock valve 34 is actuated accordingly.

After the evacuation of the airlock 13 the supporting plate shifts to its lower position, which is marked 26. The entry airlock 13 is now connected to the vacuum chamber 14. The substrate holder with the disk settles on the ledge 21 in the receiver opening of the turntable 16. In this position the substrate holder is identified at 23 on the right side of the figure, see above. The substrate lying in the substrate holder 23 bears the reference number 24 on the right in the figure.

After the supporting plate is lowered together with the substrate holder the turntable can now rotate within the vacuum chamber together with the substrate lying in the substrate holder, which has settled, by the action of the suction device 7, 8, onto the annular ledge of the turntable, as shown. The substrate is transported within the vacuum chamber to additional stations, to a coating source in the form of a sputtering cathode, for example.

For example, four stations can be disposed in the vacuum chamber. The turntable would then rotate cyclically 90 degrees at a time. After four turns one working cycle would be ended and the coated substrate passes to the position marked 24 in the figure. Then removal through the exit airlock takes place.

At the beginning of the exit action the supporting plate is raised from its position 26 to position 25. The substrate or disk thus shifts from position 23, 24 to position 22, 9. The substrate holder 22 is pressed by the supporting plate 25 against the gasket 32.

The entry airlock is thus separated from the vacuum chamber. Then the entry airlock is flooded via line 33 by switching the airlock valve 34 accordingly.

After the airlock is flooded, the suction devices 7 and 8 are activated by opening the suction line 30, so that the suction devices can suck the disk 9 and hold it, while the disk 9 jumps over the spring 39.

Figure 3:
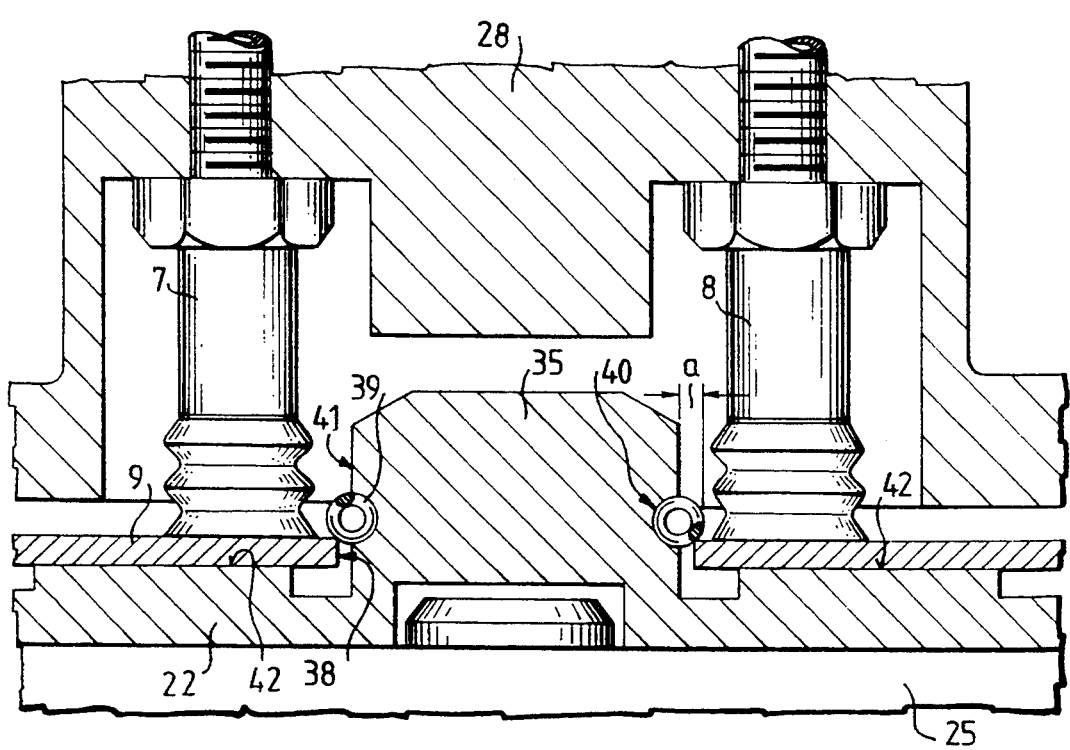
FIG. 3 is a greatly enlarged cross-sectional side view of the centering post.

Then the cover is raised by the beam and then swung 180 degrees around. The coated disk is released by the suction devices in the left position, which is not shown. As FIG. 3 shows, the worm spring 39 (slant-wound annular spring) is placed into an annular groove 40 which is of such dimensions that the worm spring 39 protrudes by an amount a which corresponds approximately to half of the diameter D of the worm spring's cross section beyond the circumferential surface 41 of the centering post 35. The opening 38 in the center of the disk is such that its diameter is slightly smaller than the diameter A of the worm spring 39.

Figure 2:
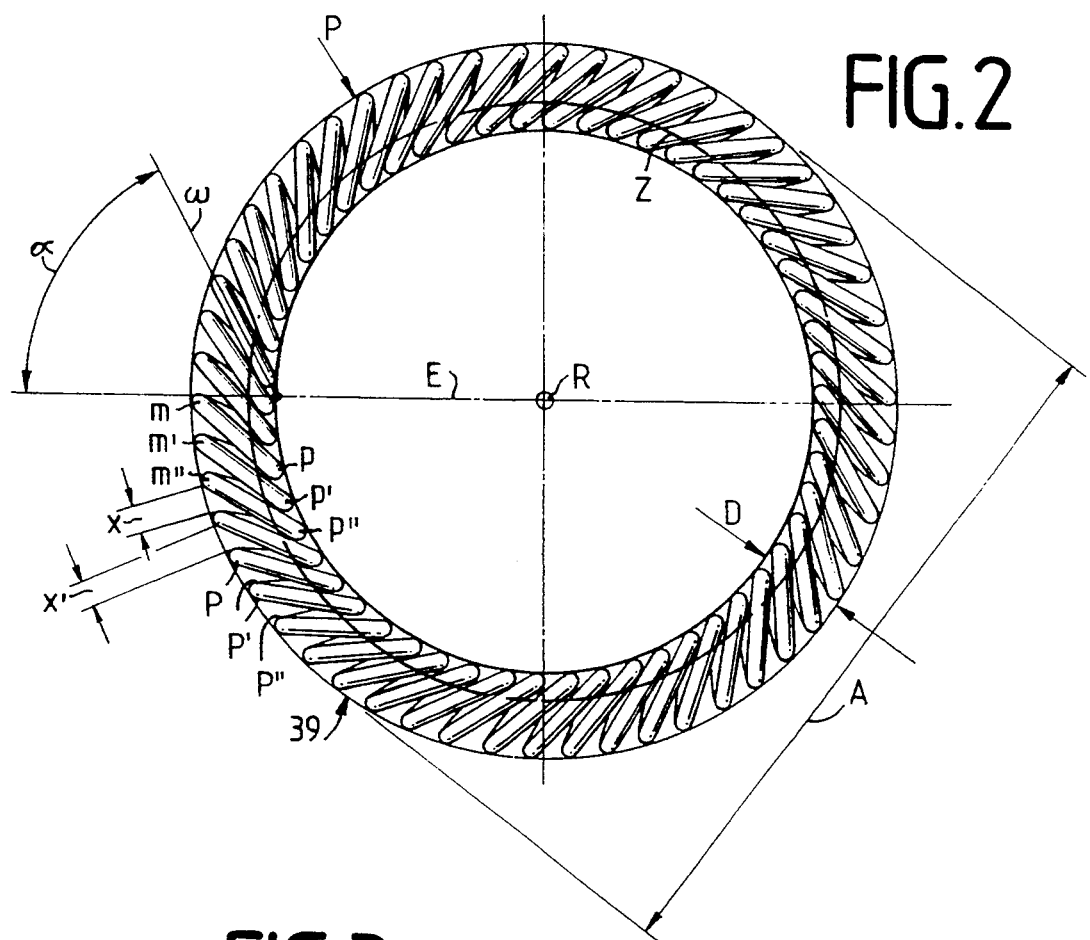
FIG. 2 shows the endless coil spring in a top view, greatly enlarged.

The worm spring 39, represented greatly enlarged in FIG. 2, has a plurality of turns relatively close to one another, and when the spring is in the relaxed state the individual turns are all at an angle $\alpha$ to the plane E lying in the rotation axis R, amounting to about 50 to 60 degrees, with the radially inside portions p, p', p'', ... of the individual turns touching one another and the radially outside portions m, m', m'', ... having a greater distance apart, x, x'', ... The curve in space or helical line formed by the turns of the spring 39 lies on the circumferential surface of a torus, and the distance x, x', ... between each pair of adjacent turns P, P' and P', P'' etc. at the , radially outside crest is greater than the diameter of the spring wire, while the pairs of adjacent turns are very close together at the radially inner crest, while the axis Z running through the geometrical centers of the turns is shifted nearer to the inner crest.

While there has been described what is considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Device for locking a flat substrate provided with a central opening, onto a substrate plate provided with a centering post projecting above a substrate bearing surface of a vacuum coating apparatus comprising: a centering post having a cross-sectional area which enables the centering post to pass through a central opening of a flat substrate and having an annular groove which runs approximately at a level of an upper surface of the substrate remote from the plane of a substrate bearing surface, an endless coil spring shaped into a toroid structure being disposed in the annular groove, a spiral area (W) determined by a coil forming an angle ($\alpha$) that is greater than 45 degrees with a plane (E) determined by a rotation axis (R) and a place where the coil contacts an inner wall of the groove in the centering post, so that upon the application to the spring of a force acting radially on an axis of rotation, the angle ($\alpha$) is augmented, and then a toroid surface enveloping the spring flattens and thus locks the substrate pushed over the spring in the area of the upper edge of the opening, in the manner of a snap fastening.

2. Device in accordance with claim 1 for locking a flat, discoid substrate onto the substrate plate.

3. Device in accordance with claim 1 for carrying the substrate from one to another treatment station.

* * * * *